United States Patent
Jang et al.

(10) Patent No.: US 8,735,923 B2
(45) Date of Patent: May 27, 2014

(54) SEMICONDUCTOR LIGHT EMITTING DEVICE AND MANUFACTURING METHOD THEREOF

(75) Inventors: Tae Sung Jang, Gyunggi-do (KR); Seok Min Hwang, Busan (KR); Su Yeol Lee, Gyunggi-do (KR); Jong Gun Woo, Gyunggi-do (KR)

(73) Assignee: Samsung Electronics Co., Ltd., Seoul (KR)

( * ) Notice: Subject to any disclaimer, the term of this patent is extended or adjusted under 35 U.S.C. 154(b) by 0 days.

(21) Appl. No.: 13/251,897

(22) Filed: Oct. 3, 2011

(65) Prior Publication Data

US 2012/0080707 A1    Apr. 5, 2012

(30) Foreign Application Priority Data

Oct. 4, 2010 (KR) .................. 10-2010-0096293

(51) Int. Cl.
*H01L 29/18* (2006.01)
*H01L 29/30* (2006.01)
*H01L 33/00* (2010.01)
*H01L 21/00* (2006.01)

(52) U.S. Cl.
USPC .................. 257/98; 257/88; 257/89; 257/99; 257/E33.061; 438/26; 438/27; 438/28; 438/29; 438/65

(58) Field of Classification Search
CPC ......... H01L 33/60; H01L 33/58; H01L 33/50; H01L 33/502; H01L 33/36
USPC .................. 257/98, E33.073, 99, 432, 88, 89, 257/E33.061, E33.067; 438/26–29, 65
See application file for complete search history.

(56) References Cited

U.S. PATENT DOCUMENTS

| | | | |
|---|---|---|---|
| 2006/0267034 A1* | 11/2006 | Orita | 257/95 |
| 2007/0200493 A1* | 8/2007 | Hsu et al. | 313/506 |
| 2008/0237613 A1* | 10/2008 | Lee et al. | 257/88 |
| 2009/0059498 A1* | 3/2009 | Jeong et al. | 361/681 |
| 2009/0184334 A1* | 7/2009 | Lee et al. | 257/98 |
| 2010/0213493 A1* | 8/2010 | Hsu et al. | 257/98 |
| 2010/0295080 A1* | 11/2010 | Lim | 257/98 |
| 2011/0012160 A1* | 1/2011 | Kitabayashi et al. | 257/98 |
| 2011/0062470 A1* | 3/2011 | Bierhuizen et al. | 257/98 |

FOREIGN PATENT DOCUMENTS

| | | |
|---|---|---|
| KR | 10-2006-0064305 A | 6/2006 |
| KR | 10-2006-0072391 A | 6/2006 |

\* cited by examiner

*Primary Examiner* — Ha Tran T Nguyen
*Assistant Examiner* — Thai T Vuong
(74) *Attorney, Agent, or Firm* — McDermott Will & Emery LLP

(57) ABSTRACT

There is provided a semiconductor light emitting device and method of making the same, having a first conductivity type semiconductor layer; an active layer formed on the first conductivity type semiconductor layer; a second conductivity type semiconductor layer formed on the active layer and including a plurality of holes; and a transparent electrode formed on the second conductivity type semiconductor layer.

11 Claims, 4 Drawing Sheets

SEMICONDUCTOR LIGHT EMITTING DEVICE AND MANUFACTURING METHOD THEREOF

CROSS-REFERENCE TO RELATED APPLICATIONS

This application claims the priority of Korean Patent Application No. 10-2010-0096293 filed on Oct. 4, 2010, in the Korean Intellectual Property Office, the disclosure of which is incorporated herein by reference.

BACKGROUND OF THE INVENTION

1. Field of the Invention

The present invention relates to a semiconductor light emitting device, and more particularly, to a vertical semiconductor light emitting device having improved light extraction efficiency and a method of manufacturing the same.

2. Description of the Related Art

A light emitting diode (LED) is a semiconductor device that can emit light of various colors due to electron-hole recombination occurring at a p-n junction between p-type and n-type semiconductors when current is supplied thereto. Such an LED is advantageous over a filament-based light emitting device in that it has a long lifespan, low power usage, superior initial-operation characteristics, and high vibration resistance. These factors have continually boosted the demand for LEDs. Notably of late, a great deal of attention has been drawn to group III nitride semiconductors that can emit light in a blue/short wavelength region.

Nitride semiconductor crystals, constituting a light emitting device using the group III nitride semiconductor, are grown on a specific growth substrate such as a sapphire or SiC substrate. However, in case of using an insulating substrate such as a sapphire substrate, there are significant limitations on the arrangement of electrodes. That is, a nitride semiconductor light emitting device according to the related art generally has electrodes arranged in a horizontal direction, such that current flow is narrow. Due to such a narrow current flow, an operation voltage Vf of the light emitting device is increased to thereby deteriorate current efficiency and be susceptible to electrostatic discharge.

In order to solve these problems, research into a semiconductor light emitting device having a vertical electrode structure is being conducted. After a light emitting structure for a light emitting diode is formed on a sapphire growth substrate using Metal Organic Chemical Vapor Deposition (MOCVD) equipment or Molecular Beam Epitaxy (MBE) equipment, a first conductivity type ohmic-contact electrode structure is formed on an upper nitride semiconductor layer, which is disposed on the uppermost portion of the light emitting structure. Then, a conductive substrate, separately prepared in addition to the growth substrate, is subjected to a wafer solder bonding process, and the growth substrate is removed, and thus, a light emitting diode having a semiconductor structure is manufactured.

In general, a vertical semiconductor light emitting device has a structure in which electrodes having different polarities are formed on upper and lower surfaces of a light emitting structure including an n-type semiconductor layer, an active layer and a p-type semiconductor layer, and is advantageous in terms of electrostatic discharge as compared with a horizontal semiconductor light emitting device. However, in order to achieve a sufficient current diffusion effect even in the vertical semiconductor light emitting device, the electrodes are required to be formed across a large area. As the area of the electrodes is increased, extraction efficiency of light emitted from the light emitting structure is reduced.

The light emission efficiency of the light emitting device is determined by internal quantum efficiency and light extraction efficiency (or external quantum efficiency). Particularly, light extraction efficiency is determined based on optical factors of the light emitting device, i.e., refractive indices of the individual elements of the light emitting structure, the flatness of an interface between the elements or the like. The internal quantum efficiency of the light emitting device reaches approximately 100%, whereas the external quantum efficiency thereof is significantly low.

This is due to a total reflection of light caused by a difference in the refractive index at an interface between the light emitting device and air when light produced in the light emitting device is emitted outside of the light emitting device. That is, since a semiconductor layer constituting the light emitting device has a refractive index larger than that of external air or the substrate, a critical angle determining an incident angle range in which light can be emitted is reduced. As a result, a considerable amount of light emitted from the active layer is totally reflected internally such that it may travel towards a side of the light emitting device, and accordingly, a certain amount thereof may be lost or emitted in an undesirable lateral direction. When the light produced within the light emitting device strikes the surface of the light emitting device, if the incident angle thereof is larger than the critical angle, the light is reflected internally without being extracted to the outside.

Furthermore, the light emitted from the active layer is extracted to the outside after passing through the n-type semiconductor layer in an isotropic direction. As shown in FIG. 1, light (a) emitted from the active layer in a substantially vertical direction may be extracted along a short path, whereas light (b) emitted from the active layer in an inclined direction may follow a long path and be considerably absorbed by the semiconductor layer. As a result, the light extraction efficiency of the light emitting device is further reduced.

SUMMARY OF THE INVENTION

An aspect of the present invention provides a semiconductor light emitting device allowing for superior light extraction efficiency.

An aspect of the present invention also provides a method of manufacturing the above-mentioned semiconductor light emitting device efficiently.

According to an aspect of the present invention, there is provided a semiconductor light emitting device including: a first conductivity type semiconductor layer; an active layer provided on the first conductivity type semiconductor layer; a second conductivity type semiconductor layer provided on the active layer and including a plurality of holes; and a transparent electrode provided on the second conductivity type semiconductor layer.

According to another aspect of the present invention, there is provided a method of manufacturing a semiconductor light emitting device, the method including: forming a second conductivity type semiconductor layer, an active layer and a first conductivity type semiconductor layer on a growth substrate; forming a conductive substrate on the first conductivity type semiconductor layer; separating the growth substrate from the second conductivity type semiconductor layer and forming a plurality of holes in the second conductivity type semiconductor layer; and forming a transparent electrode on the second conductivity type semiconductor layer.

The plurality of holes may be disposed in a thickness direction of the second conductivity type semiconductor layer.

The plurality of holes may be filled with a light transmissive material having a refractive index lower than that of the second conductivity type semiconductor layer.

The plurality of holes may be filled with air.

The transparent electrode may be formed without filling the plurality of holes.

The transparent electrode may have unevenness portions on a light emitting surface thereof.

The unevenness portions may be correspondingly disposed above the holes formed in the second conductivity type semiconductor layer.

The unevenness portions may be arranged to have uniform shapes and intervals.

The unevenness portions may have a lenticular, hemispherical, prismatic, conic, or polypyramidical shape.

The transparent electrode may be formed without filling the plurality of holes and may be formed in an oblique deposition process.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Figure 1:
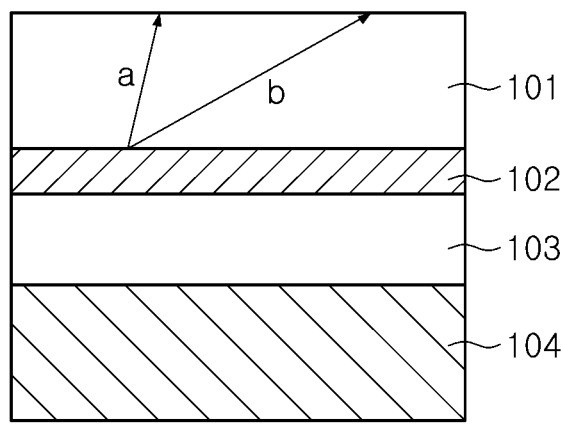
FIG. 1 is a view schematically showing a path of light produced in an active layer within a semiconductor light emitting device.

Embodiments of the present invention will now be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions of elements may be exaggerated for clarity, and the same reference numerals will be used throughout to designate the same or like elements.

Figure 2A:
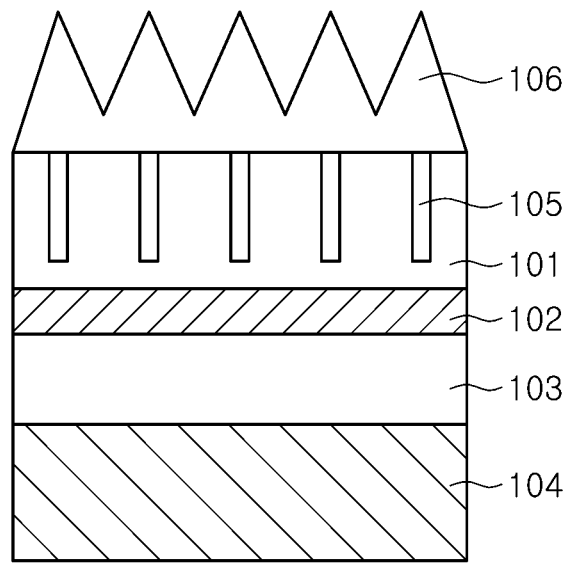
FIGS. 2A and 2B are cross-sectional views schematically showing a semiconductor light emitting device in which a transparent electrode having unevenness portions on a light emitting surface thereof is formed on a second conductivity type semiconductor layer including a plurality of holes according to an embodiment of the present invention.
Figure 2B:
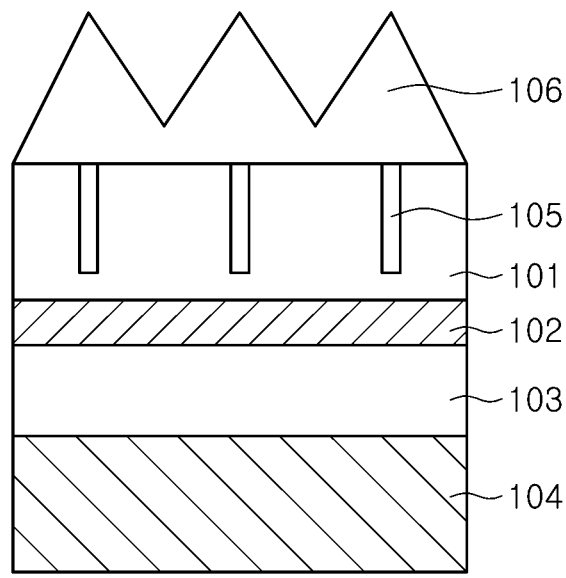

FIGS. 2A and 2B are cross-sectional views illustrating a semiconductor light emitting device according to an embodiment of the invention. With reference to FIGS. 2A and 2B, a semiconductor light emitting device according to an embodiment of the invention may be made by forming a light emitting structure on a conductive substrate 104. The light emitting structure may have a first conductivity type semiconductor layer 103, an active layer 102 and a second conductivity type semiconductor layer 101 stacked sequentially. The second conductivity type semiconductor layer 101 may include a plurality of holes 105. In this case, the plurality of holes 105, which are inessential elements, may be formed in a thickness direction of the second conductivity type semiconductor layer 101 such that a path of light within the second conductivity type semiconductor layer 101 may be effectively shortened, and a detailed description thereof will be provided below. An electrode, particularly a transparent electrode 106, may be formed on an upper surface of the second conductivity type semiconductor layer 101. The transparent electrode 106 may be provided without filling the plurality of holes and may include unevenness portions. In addition, a bonding pad (not shown) may be provided on the transparent electrode 106 for wire-bonding or the like.

The first and second conductivity type semiconductor layers 103 and 101 may be p-type and n-type semiconductor layers, respectively, and may be formed of a nitride semiconductor; however, the invention is not limited thereto. In the present embodiment, it may be understood that the first conductivity type semiconductor layer and the second conductivity type semiconductor layer are respectively a p type semiconductor layer and an n type semiconductor layer. The first and second conductivity type semiconductor layers 103 and 101 may have a composition formula of $Al_xIn_yGa_{(1-x-y)}N$ ($0 \le x \le 1$, $0 \le y \le 1$, $0 \le x+y \le 1$), and a material such as GaN, AlGaN, or InGaN may correspond thereto. The active layer 102 provided between the first and second conductivity type semiconductor layers 103 and 101 emits light having a predetermined level of energy through electron-hole recombination. The active layer 102 may have a multi-quantum well (MQW) structure in which quantum well and quantum barrier layers are alternately stacked. The multi-quantum well structure may employ an InGaN/GaN structure, for example.

In the semiconductor light emitting device according to this embodiment of the invention, a reflective metal layer (not shown) may be provided on the conductive substrate 104. The reflective metal layer may reflect light emitted from the active layer 102 towards an upper portion of the semiconductor light emitting device, i.e., towards the second conductivity type semiconductor layer 101. Further, the reflective metal layer may form an ohmic-contact with the first conductivity type semiconductor layer 103. Considering these functions, the reflective metal layer may include Ag, Ni, Al, Rh, Pd, Ir, Ru, Mg, Zn, Pt, Au or the like. In this case, the reflective metal layer may have two or more layers to thereby improve reflectivity efficiency. For example, Ni/Ag, Zn/Ag, Ni/Al, Zn/Al, Pd/Ag, Pd/Al, Ir/Ag. Ir/Au, Pt/Ag, Pt/Al, Ni/Ag/Pt or the like may be used therefor.

The conductive substrate 104, attachable to the reflective metal layer, may serve as a support that supports the light emitting structure when a process such as a laser lift-off process is undertaken. The conductive substrate 104 may be formed of a material including any one of Au, Ni, Al, Cu, W, Si, Se, and GaAs, for example, a Si substrate doped with Al. In this case, the conductive substrate 104 may be subjected to a plating process, a bonding process or the like, according to a selected material. In the present embodiment, the conductive substrate 104 may be electrically connected to the first conductivity type semiconductor layer 103, and accordingly, an electrical signal may be applied to the first conductivity type semiconductor layer 103 through the conductive substrate 104.

In addition, an adhesive layer may be provided between the reflective metal layer and the conductive substrate. The adhesive layer may improve adhesion between the conductive substrate and the reflective metal layer, thereby preventing the conductive substrate from being separated from the reflective metal layer.

Furthermore, a diffusion barrier layer may be provided between the adhesive layer and the reflective metal layer. The diffusion barrier layer prevents metallic elements from being diffused from the adhesive layer or the conductive substrate into the reflective metal layer such that it may enhance the reflectivity of the reflective metal layer.

In the present embodiment, the second conductivity type semiconductor layer 101 may include the plurality of holes 105.

The holes 105 may be formed from an interface between the second conductivity type semiconductor layer 101 and the transparent electrode 106. The depth of the holes 105 may be 50% or greater, preferably 70% or greater, more preferably 95% or greater of the thickness of the second conductivity type semiconductor layer 101 from the interface between the second conductivity type semiconductor layer 101 and the transparent electrode 106. The holes 105 may be formed to be adjacent to the active layer 102 without contacting the active layer 102.

Meanwhile, the shape of the holes may be cylindrical, polyprismatic, or the like; however, the invention is not limited thereto.

Figure 3:
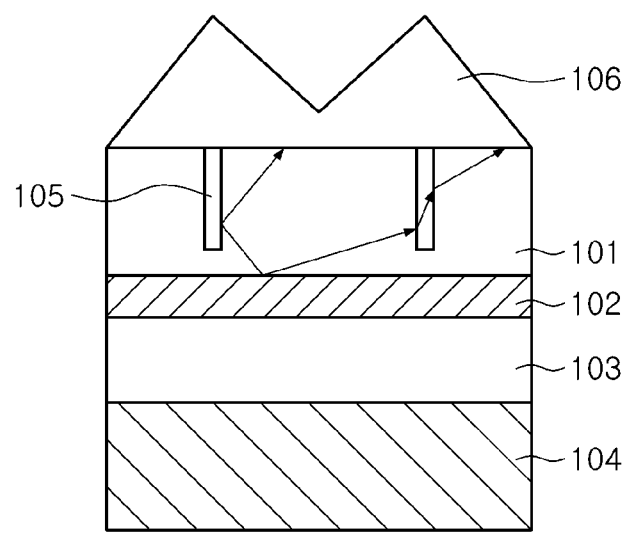
FIG. 3 is a view schematically showing a path of light within a semiconductor light emitting device including a second conductivity type semiconductor layer having holes formed therein according to an embodiment of the present invention.

In the case in which the holes 105 are formed in the second conductivity type semiconductor layer 101, the refractive index of the holes 105 is lower than that of the second conductivity type semiconductor layer 101 since the refractive index of the holes 105 is 1 corresponding to air, while the refractive index of the second conductivity type semiconductor layer 101 (for example, GaN) is approximately 2.4. Accordingly, a path of light is effectively shortened as shown in FIG. 3, whereby the absorption of light by the second conductivity type semiconductor layer 101 may be minimized. Specifically, light incident at more than a predetermined angle (critical angle) with respect to the holes 105 among light emitted from the active layer 102 is totally reflected by the holes 105 without light loss to thereby travel to an upper portion of the second conductivity type semiconductor layer 101. Accordingly, the path of light may be shortened as compared with a case in which light is directed towards a side of the second conductivity type semiconductor layer 101 due to an absence of the holes 105. This is because light reaching the side of the second conductivity type semiconductor layer 101 is reflected to thereby move inwardly of the second conductivity type semiconductor layer 101. In case of light incident at less than a predetermined angle (critical angle) with respect to the holes 105 among light emitted from the active layer 102, a path thereof is altered at an interface between the hole 105 and the second conductivity type semiconductor layer 101 such that the light is directed to the upper portion of the second conductivity type semiconductor layer 101. Accordingly, the path of light may also be shortened as compared with a case in which light is directed towards the side of the second conductivity type semiconductor layer 101 due to an absence of the holes 105. As a result, the amount of light absorbed by the second conductivity type semiconductor layer 101 is reduced to thereby improve light extraction efficiency.

Meanwhile, the holes 105 may be filled with a light transmissive material having a refractive index lower than that of the second conductivity type semiconductor layer 101, for example, $SiO_2$. That is, the holes 105 may be filled with a light transmissive material having a refractive index larger than 1 and lower than the refractive index of the second conductivity type semiconductor layer 101. As a difference in the refractive index between the holes and the second conductivity type semiconductor layer increases, a path of light is shortened, whereby light extraction efficiency may be effectively increased.

An n-type electrode is formed on the upper surface of the second conductivity type semiconductor layer 101 in order to supply current. In this manner, current is supplied to the semiconductor light emitting device through the conductive substrate and the electrode so that light can be emitted. The n-type electrode may have a single layer or a plurality of layers formed of a material selected from Ti, Cr, Al, Cu and Au.

Meanwhile, a buffer layer may be additionally provided between the second conductivity type semiconductor layer 101 and the n-type electrode in various embodiments of the invention.

The n-type electrode may be formed as the transparent electrode 106 on the second conductivity type semiconductor layer 101 such that the amount of light reflected or blocked by the electrode may be reduced. The transparent electrode 106 may be formed of a material allowing for light transmission in addition to current diffusion. For example, the transparent electrode 106 may have at least one layer formed of an oxide selected from indium tin oxide (ITO), indium oxide (IO)), tin oxide ($SnO_2$), zinc oxide (ZnO) and indium zinc oxide (IZO). The transparent electrode 106 may not fill the holes 105.

Furthermore, a light emitting surface of the transparent electrode 106 may include unevenness portions. Since uniform light emissions are obtained by allowing the shape and intervals of the unevenness portions to be uniform, the unevenness portions may be disposed uniformly on the light emitting surface of the transparent electrode 106.

The shape of the unevenness portions may be lenticular, hemispherical, prismatic, conic, polypyramidical; however, the invention is not limited thereto.

As shown in FIGS. 2A and 2B, the unevenness portions may be correspondingly disposed above the holes 105 formed in the second conductivity type semiconductor layer 101 for improved light extraction efficiency. That is, in a case in which the intervals between the holes are increased as shown in FIG. 2B, the intervals between the unevenness portions formed on the light emitting surface of the transparent electrode may also be correspondingly increased.

Hereinafter, a method of manufacturing a semiconductor light emitting device having the above-described configurations will be described.

FIGS. 4 through 7 are cross-sectional views schematically illustrating a method of manufacturing a semiconductor light emitting device according to an embodiment of the invention.

Figure 4:
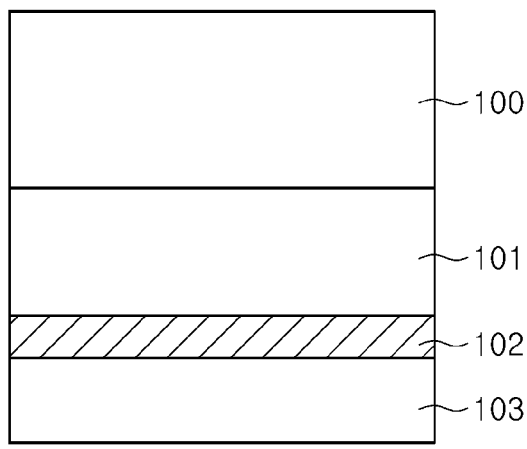
FIGS. 4 through 7 are cross-sectional views showing a method of manufacturing a semiconductor light emitting device according to an embodiment of the present invention.

First of all, as shown in FIG. 4, a light emitting structure is formed by sequentially stacking the second conductivity type semiconductor layer 101, the active layer 102 and the first conductivity type semiconductor layer 103 on a growth substrate 100 using a semiconductor-layer growth process such as Metal Organic Chemical Vapor Deposition (MOCVD), Molecular Beam Epitaxy (MBE), Hydride Vapor Phase Epitaxy (HVPE), or the like. The growth substrate 100 utilizes a substrate formed of sapphire, SiC, $MgAl_2O_4$, MgO, $LiAlO_2$, $LiGaO_2$, GaN or the like. Sapphire is a crystal having Hexa-Rhombo R3c symmetry and has a lattice constant of 13.001 Å along a C-axis and a lattice constant of 4.758 Å along an A-axis. Orientation planes of the sapphire include a C (0001) plane, an A (1120) plane, an R (1102) plane, and the like. Particularly, the C plane is mainly used as a substrate for nitride growth because it relatively facilitates the growth of a nitride film and is stable at high temperatures.

Figure 5:
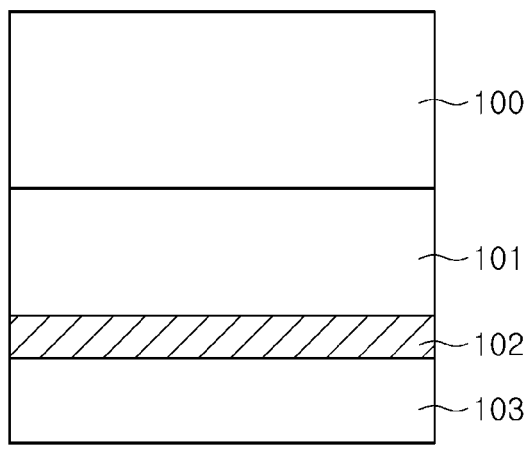

Next, as shown in FIG. 5, the conductive substrate 104 is formed on the first conductivity type semiconductor layer 103. The conductive substrate 104 may be formed by a plating process, a sputtering process, a deposition process or the like. Alternatively, the conductive substrate separately manufactured in advance may be attached by using a conductive adhesive layer (not shown).

The reflective metal layer may be formed between the first conductivity type semiconductor layer 103 and the conductive substrate 104. The reflective metal layer may be formed of at least one of Ag, Ni, Al, Rh, Pd, Ir, Ru, Mg, Zn, Pt, Au or the like, in consideration of light reflectivity and ohmic-contact with the first conductivity type semiconductor layer 103. Here, a process known in the art such as a sputtering process, a deposition process or the like may be appropriately used.

Thereafter, the growth substrate 100 is removed to expose the second conductivity type semiconductor layer 101. In this case, the growth substrate 100 may be removed by a laser lift-off process, a chemical lift-off process, or the like.

Figure 6:
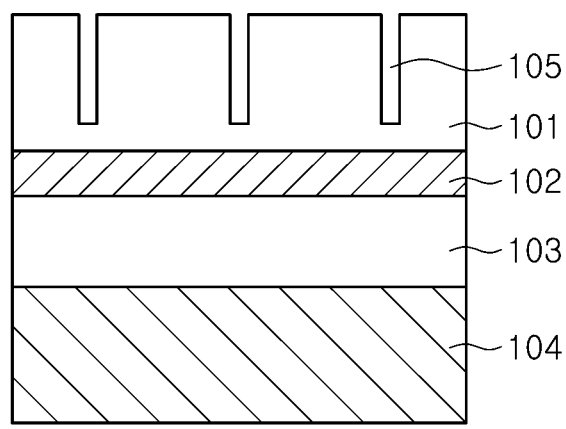
Figure 7:
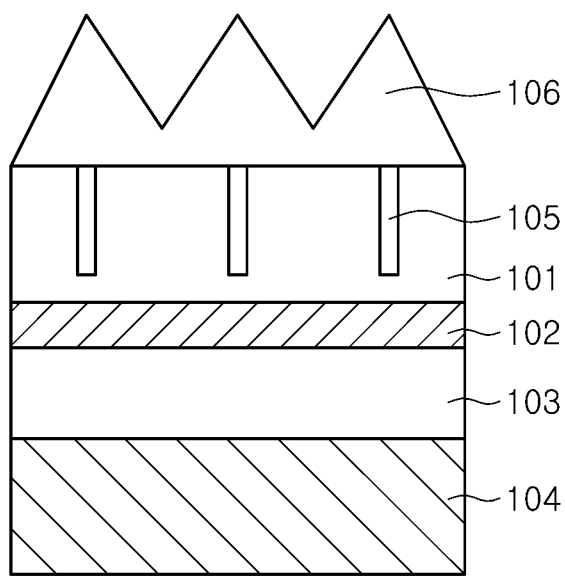

Then, as shown in FIG. 6, portions of the second conductivity type semiconductor layer 101 are etched to form the holes 105. To enable this, a mask is formed on the second conductivity type semiconductor layer 101 except for the portions thereof in which the holes are to be formed. In this case, an etching process for forming the holes may include various processes known in the art such as a wet etching process, a dry etching process or the like. For example, an inductively coupled plasma reactive ion etching (ICP-RIE) process may be used.

The holes 105 may be formed to be adjacent to the active layer 102 from the interface between the second conductivity type semiconductor layer 101 and the transparent electrode 106, without contacting the active layer 102.

Furthermore, the holes 105 may be filled with a light transmissive material having a refractive index lower than that of the second conductivity type semiconductor layer 101, for example, $SiO_2$. However, as a difference in the refractive index between the holes and the second conductivity type semiconductor layer increases, a path of light is shortened, whereby light extraction may be effective. Taking this into consideration, the holes may be filled with air to be maintained in an air gap state without being filled with a transparent material.

The transparent electrode 106 is formed on the second conductivity type semiconductor layer 101. The transparent electrode 106 may be formed of indium tin oxide (ITO), indium oxide (IO)), tin oxide ($SnO_2$), zinc oxide (ZnO) and indium zinc oxide (IZO) or the like. The deposition of the transparent electrode 106 may be performed by a process known in the art, such as an electron beam evaporation process, a sputtering process, an ion-beam-assisted deposition (IBAD) process or the like. Here, the holes formed in the second conductivity type semiconductor layer 101 should be maintained. To enable this, in a case in which a directional deposition process is used to thereby reduce an incident angle of deposition, the holes may be effectively maintained while not being filled with the transparent electrode. In this case, an oblique deposition process may be used.

Furthermore, the light emitting surface of the transparent electrode 106 may include the unevenness portions. Since uniform light emissions are obtained by allowing the shapes and intervals of the unevenness portions to be uniform, the unevenness portions may be disposed uniformly on the light emitting surface of the transparent electrode 106.

The shape of the unevenness portions may be lenticular, hemispherical, prismatic, conic, polypyramidical; however, the invention is not limited thereto.

The unevenness portions may be correspondingly disposed above the holes formed in the second conductivity type semiconductor layer 101 for improved light extraction efficiency. That is, in a case in which the intervals between the holes are increased, the intervals between the unevenness portions formed on the light emitting surface of the transparent electrode may also be increased correspondingly.

As set forth above, in a semiconductor light emitting device according to embodiments of the invention, holes are formed in a second conductivity type semiconductor layer and a difference in a refractive index therebetween allows a path of light to be shortened such that the amount of light absorbed by the second conductivity type semiconductor layer is reduced, and an n-type electrode is formed as a transparent electrode having unevenness portions on a light emitting surface thereof such that the amount of light blocked by the electrode is reduced, whereby light extraction efficiency can be enhanced.

While the present invention has been shown and described in connection with the embodiments, it will be apparent to those skilled in the art that modifications and variations can be made without departing from the spirit and scope of the invention as defined by the appended claims.

What is claimed is:

1. A semiconductor light emitting device, comprising:
a first conductivity type semiconductor layer;
an active layer disposed on the first conductivity type semiconductor layer;
a second conductivity type semiconductor layer disposed on the active layer and including a plurality of holes having a depth less than the entire thickness of the second conductivity type semiconductor; and
a transparent electrode disposed on the second conductivity type semiconductor layer, wherein:
the transparent electrode has a plurality of protrusive portions on a light emitting surface thereof, and
the plurality of protrusive portions are disposed above corresponding ones of the holes defined in the second conductivity type semiconductor layer.

2. The semiconductor light emitting device of claim 1, wherein the plurality of holes are disposed in a thickness direction of the second conductivity type semiconductor layer.

3. The semiconductor light emitting device of claim 1, wherein the plurality of holes are filled with a light transmissive material having a refractive index lower than that of the second conductivity type semiconductor layer.

4. The semiconductor light emitting device of claim 1, wherein the plurality of holes are filled with air.

5. The semiconductor light emitting device of claim 1, wherein the transparent electrode is formed without filling the plurality of holes.

6. The semiconductor light emitting device of claim 1, wherein the plurality of protrusive portions have a uniform shape.

7. The semiconductor light emitting device of claim 1, wherein the plurality of protrusive portions have a lenticular, hemispherical, prismatic, conic, or polypyramidical shape.

8. The semiconductor light emitting device of claim 1, wherein the plurality of holes are disposed on the one surface of the second conductivity type semiconductor layer that is opposite to a surface of the second conductivity type semiconductor layer contacting the active layer.

9. The semiconductor light emitting device of claim 1, wherein a surface of the second conductivity type semiconductor layer contacting the active layer does not have holes formed therein.

10. The semiconductor light emitting device of claim 1, wherein the transparent electrode is provided on the one surface of the second conductivity type semiconductor layer having the plurality of holes.

11. The semiconductor light emitting device of claim 10, wherein the transparent electrode is provided on the one surface of the second conductivity type semiconductor layer so as not to extend into the plurality of holes.

* * * * *